(12) United States Patent
Thompson

(10) Patent No.: US 11,353,364 B2
(45) Date of Patent: Jun. 7, 2022

(54) THERMAL IMAGING FOR WITHIN WAFER VARIABILITY FEEDFORWARD OR FEEDBACK INFORMATION

(71) Applicant: Lam Research Corporation, Fremont, CA (US)

(72) Inventor: William Dean Thompson, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/249,317

(22) Filed: Feb. 26, 2021

(65) Prior Publication Data

US 2021/0270673 A1   Sep. 2, 2021

Related U.S. Application Data

(60) Provisional application No. 62/983,950, filed on Mar. 2, 2020.

(51) Int. Cl.
*G01J 5/00*   (2022.01)
*H04N 5/33*   (2006.01)
*G01J 5/48*   (2022.01)

(52) U.S. Cl.
CPC .............. *G01J 5/0007* (2013.01); *H04N 5/33* (2013.01); *G01J 5/48* (2013.01); *G01J 2005/0077* (2013.01)

(58) Field of Classification Search
CPC .............. G01J 5/0007; G01J 2005/0077; G01J 2005/0081; H04N 5/33
See application file for complete search history.

(56) References Cited

U.S. PATENT DOCUMENTS

| 7,595,869 B1 | 9/2009 | Tian et al. |
| 9,245,761 B2 | 1/2016 | Singh et al. |
| 2005/0136346 A1* | 6/2005 | Ottens ................. G03F 7/70616 430/30 |
| 2006/0247816 A1 | 11/2006 | Prager et al. |
| 2009/0083013 A1* | 3/2009 | Li ......................... H01L 22/12 703/6 |

(Continued)

FOREIGN PATENT DOCUMENTS

WO   WO-2016190905 A1   12/2016

OTHER PUBLICATIONS

Hopper, et al., "Improved Infrared Imaging of Semiconductor Devices" Microscopy: advances in scientific research and education (A. Mendez-Vilas, Ed.) FORMATEX 2014, pp. 697-702.

(Continued)

*Primary Examiner* — David P Porta
*Assistant Examiner* — Meenakshi S Sahu
(74) *Attorney, Agent, or Firm* — Weaver Austin Villeneuve & Sampson LLP

(57) ABSTRACT

IR radiation may be used to examine substrates prior to a fabrication operation in order to adjust processing parameters of the fabrication operation, or to determine features of the substrate. A thermographic image may be collected and provided to a transfer function or machine learning model to determine processing parameters or features. The processing parameters may improve the uniformity of the wafer and/or achieve a desired target feature value.

19 Claims, 12 Drawing Sheets

(56) References Cited

U.S. PATENT DOCUMENTS

| | | | |
|---|---|---|---|
| 2011/0249115 A1* | 10/2011 | Genest | G01N 25/72 |
| | | | 348/125 |
| 2013/0114088 A1* | 5/2013 | Newman | G01M 5/0058 |
| | | | 356/520 |
| 2014/0302681 A1 | 10/2014 | Paterson et al. | |
| 2016/0248994 A1* | 8/2016 | Liu | H04N 13/204 |
| 2019/0072482 A1 | 3/2019 | Feng et al. | |

OTHER PUBLICATIONS

International Search Report and Written Opinion dated Nov. 17, 2020 issued in Application No. PCT/US2020/070384.
Kota, et al., "Advanced process control for polysilicon gate etching using integrated optical CD metrology," Proc. SPIE 5044, Advanced Process Control and Automation, Jul. 1, 2003, pp. 1-8. doi:10.1117/12.487635.
NOVA Process Insights [Webpage] "Machine Learning" (2019) pp. 1-3. https://www.novami.com/nova-technology/machine-learning/ [retrieved on Jun. 5, 2019].

* cited by examiner

THERMAL IMAGING FOR WITHIN WAFER VARIABILITY FEEDFORWARD OR FEEDBACK INFORMATION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Smaller technology nodes and more complex device designs naturally introduce variations in electronic device characteristics across wafers and between wafers. Without compensation, advanced etch processes routinely produce non-uniform features across a wafer. For example the critical dimension (CD), etch depth, etc. of an etched feature may vary from one position on a wafer to another. While metrology can identify non-uniformities and thereby allow process engineers to modify processing operations during production, the time spent identifying problems and determining appropriate corrections requires additional time and resources.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are methods and systems of capturing thermographic images and using them to determine properties of substrates or processing parameters for a fabrication operation. In one aspect of the embodiments disclosed herein, a method is provided, the method including: obtaining a thermographic image of a partially processed wafer, where the thermographic image contains infrared (IR) radiation intensity values for a plurality of positions of a surface of the wafer; determining processing parameters for a fabrication operation by a process chamber based at least in part on the thermographic image, and applying the processing parameters to the process chamber for the fabrication operation.

In some implementations, the fabrication operation may be performed on the wafer using the processing parameters. In some implementations, the fabrication operation may be performed on a second wafer using the processing parameters. In some implementations, the method further includes placing the partially processed wafer proximate to a thermal source prior to obtaining the thermographic image. In some implementations, obtaining a thermographic image includes heating the wafer to a target temperature and detecting IR radiation from the surface of the wafer for the plurality of positions. In some implementations, heating the wafer to a target temperature includes exposing the wafer to a thermal source with a low emissivity coating. In some implementations, the low emissivity may be an emissivity less than about 0.02. In some implementations, the wafer may be in thermally conductive contact with the thermal source.

In some implementations, detecting IR radiation from the surface of the wafer for the plurality of positions occurs at a first time after directing IR radiation through the wafer. In some implementations, the method further including obtaining one or more additional thermographic images by detecting IR radiation from the surface of the wafer for a plurality of positions at one or more second times after flashing the wafer with a thermal source, and where determining processing parameters may be further based on the one or more additional thermographic images.

In some implementations, the IR intensity values represent IR radiation emitted by the wafer. In some implementations, obtaining a thermographic image includes: directing IR radiation through the wafer and detecting IR radiation from the surface of the wafer for the plurality of positions. In some implementations, the IR radiation may be from a thermal source exhibiting a high emissivity. In some implementations, the high emissivity may be an emissivity greater than about 0.99. In some implementations, the wafer may be not in thermally conductive contact or thermally convective contact with the thermal source. In some implementations, the IR intensity values at least partially represent IR radiation emitted by the thermal source and transmitted by the wafer.

In some implementations, obtaining a thermographic image may be performed under vacuum. In some implementations, obtaining a thermographic image may be performed at about atmospheric pressure. In some implementations, the processing parameters include one or more of: radial temperature values for a pedestal in the process chamber, azimuthal temperature vales for a pedestal in the process chamber, process gas conditions, plasma conditions, or a vertical position of a pedestal. In some implementations, the process chamber has a pedestal having a plurality of independently controllable temperature control zones arranged in proximity to a location of a substrate during the fabrication operation, and the plurality of positions of the thermographic image are based on the plurality of independently controllable temperature control zones.

In some implementations, obtaining a thermographic image includes filtering IR radiation using a wavelength filter. In some implementations, filtering IR radiation using a wavelength filter may be based upon a target layer on the surface of the wafer. In some implementations, obtaining a thermographic image includes detecting IR radiation using a hyperspectral detector. In some implementations, obtaining a thermographic image includes detecting IR radiation using an IR detector with a detection spectrum including wavelengths between about 6 μm and about 14 μm. In some implementations, obtaining a thermographic image includes detecting IR radiation using an IR detector with a pixel pitch of about 5-20 μm.

In some implementations, determining processing parameters further includes analyzing the thermographic image using a transfer function. In some implementations, the transfer function may be implemented as a trained machine learning model. In some implementations, the transfer function may be implemented as a neural network. In some implementations, the transfer function outputs properties of the wafer, and the processing parameters are determined based at least in part upon the properties of the wafer. In some implementations, the processing parameters compensate for non-uniformities across the wafer.

In some implementations, the method further includes: obtaining a second thermographic image of a second partially processed wafer, where the second thermographic image contains IR radiation intensity values for a plurality of positions of a surface of the second wafer, determining updated processing parameters for the fabrication operation by the process chamber based at least in part on the second thermographic image, and applying the updated processing parameters to the process chamber for the fabrication operation. In some implementations, the fabrication operation may be performed on n wafers using the processing parameters before applying the updated processing parameters.

In another aspect of the embodiments disclosed herein, a method includes: receiving a substrate including fully or partially fabricated integrated circuits; obtaining a thermographic image of the substrate, where the thermographic image includes radiation intensity values for a plurality of positions of a surface of the substrate; determining one or more properties of the substrate using at least the thermographic image; and reporting the one or more properties of the substrate.

These and other features of the disclosed embodiments will be described in detail below with reference to the associated drawings.

DETAILED DESCRIPTION

Terminology

Figure 1:
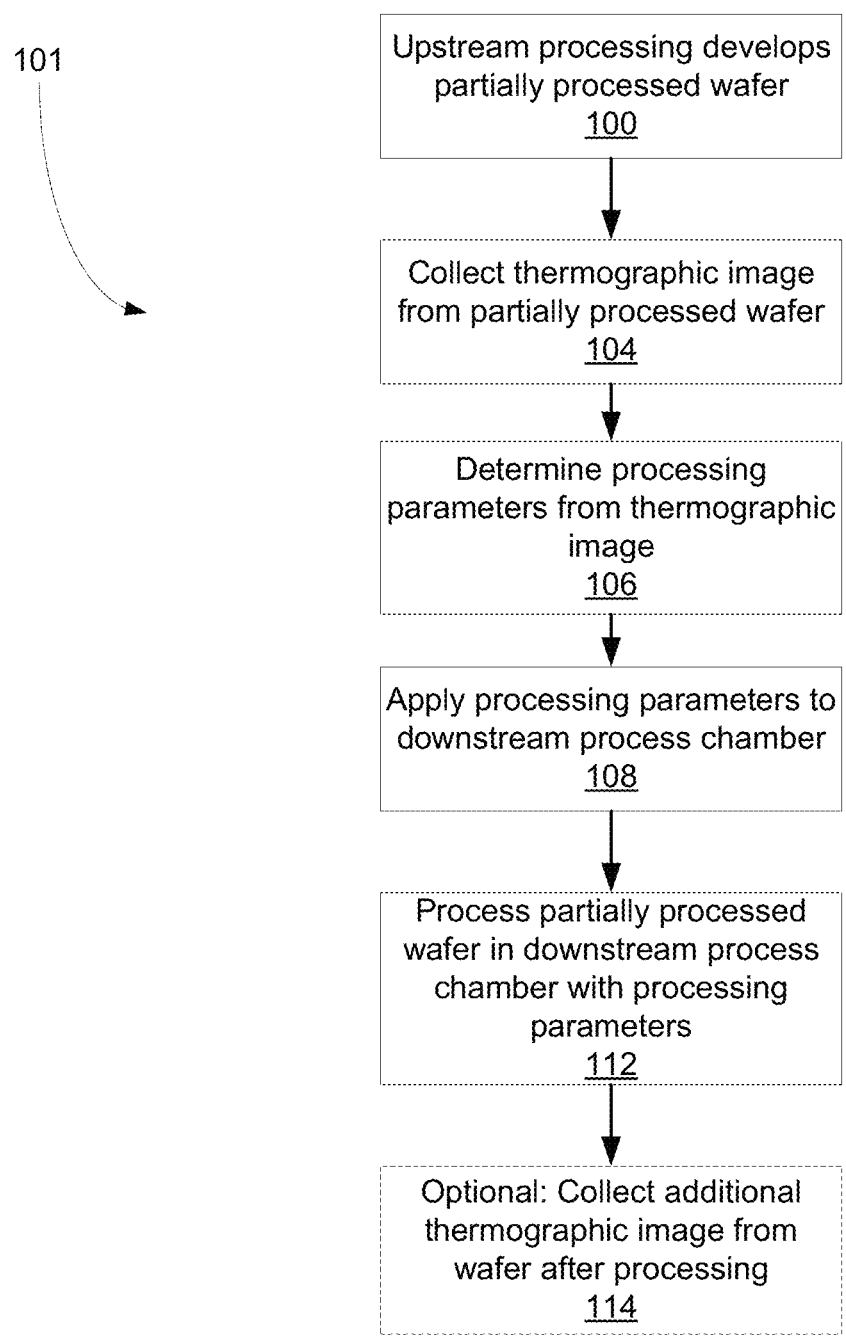
FIGS. 1-2 present flow diagrams of an automated non-uniformity corrective process for various example embodiments.

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like.

A "semiconductor device fabrication operation" or "fabrication operation," as used herein, is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such etch process may etch a stack of layers in the substrate.

"Process chamber," "Manufacturing equipment," or "fabrication tool" refers to equipment in which a manufacturing process takes place that may produce defects in a semiconductor substrate or other workpiece. Manufacturing equipment often has a processing chamber in which the workpiece resides during processing. Typically, when in use, manufacturing equipment perform one or more semiconductor device fabrication operations. Examples of manufacturing equipment for semiconductor device fabrication include additive process reactors such as electroplating cells, physical vapor deposition reactors, chemical vapor deposition reactors, and atomic layer deposition reactors, and subtractive process reactors such as dry etch reactors (e.g., chemical and/or physical etch reactors), wet etch reactors, and ashers.

In various embodiments, a process reactor or other manufacturing equipment includes a tool for holding a substrate during processing. Such tool is often a pedestal or chuck, and these terms are sometimes used herein as a shorthand for referring to all types of substrate holding or supporting tools that are included in manufacturing equipment.

A "Thermographic Image" is a two-dimensional map of infrared (IR) radiation intensity values for multiple spatial positions of a substrate. The spatial points may correspond with the pixels of a sensor, such as a camera. The intensity values represent a spectrum of wavelengths captured by the pixels of the camera. In some embodiments, the intensity values correspond with a particular wavelength range, such as IR wavelengths where silicon is transparent. In other embodiments the intensity values may correspond with a spectrum of wavelengths emitted or absorbed by a particular material, such as a thin layer deposited or etched on the substrate.

The intensity value for a single spatial point may be determined by various methods, including determining the sum contribution from all wavelengths within a range, an average intensity, a peak intensity, or a different metric. Notably, a thermographic image need not be viewable. A digital representation of intensity versus position is all that is required as an input to a model for determining settings of a process chamber.

In some embodiments a thermographic image is multiple images, where each image represents different wavelength ranges, e.g., each spectrum may be tuned for a particular material. In other embodiments multiple images may be taken representing the same wavelength, and the multiple images may be processed to form a single image or provided to a model.

In some embodiments a thermographic image is captured by sensing radiation emitted by or transferred through a substrate. As will be discussed further below, in some embodiments a substrate may be heated to a target temperature and act as a radiation emitter. In other embodiments, a substrate may be placed proximate to a thermal source and absorb and/or transmit radiation from the thermal source.

The resolution of a thermographic image is determined by the sensor in an IR detector, e.g., the number of pixels governs the resolution. The minimum resolution may be set may be set based on the size of a region on the wafer surface over which the process chamber has an ability to vary a parameter (e.g., temperature can be varied by at most 5 degrees C. over two centimeters). For example, if the control is limited to an individually controllable temperature zone, the resolution need not be significantly smaller than the size of an individual zone. Zone controllable wafer chucks may permit variable heating over small distance on a wafer's surface. In some embodiments, the resolution of the thermographic image is such that a pixel of a sensor corresponds to a 500 $\mu m^2$ area of the surface of a wafer. Notably, a thermographic image does not need to have resolution at a device level. This is different from many spot-based metrology techniques such as reflectometry, X-ray spectroscopic techniques, and electron microscopy. Conversely, a thermographic image provides a better resolution than techniques that give a single value for the wafer, such as a mass measurement of the wafer.

A "thermal source" may be any of a variety of sources of thermal energy or IR radiation that can be directed to and/or through a substrate. In some embodiments, a thermal source is a chuck or pedestal that a wafer sits on having one or more temperature controllable zones. In other embodiments, a thermal source may be an IR radiation source such as an IR LED that may be positioned above or below a wafer. In some embodiments, a thermal source is an incoherent source, emitting IR energy across a spectrum and is potentially isotropic, for example an IR LED or a high temperature pedestal or electrostatic chuck. In other embodiments, a thermal source is a coherent source, such as a laser, that emits radiation within a narrow wavelength, such as between about 6 µm and about 14 µm, typically in a specific direction. In some embodiments the laser has a tunable range.

An "IR detector" is a sensor, such as a camera, that is capable of sensing IR radiation. In some embodiments an IR detector may be a hyperspectral detector. A hyperspectral detector may collect intensity values across multiple bands of the electromagnetic spectrum per pixel, allowing a subsection of spectra that is of interest to be isolated and examined. In some embodiments the IR detector has a detection spectrum comprising wavelengths between about 6 µm and about 14 µm. In some embodiments the IR detector has a pixel pitch of about 5-20 µm.

Machine learning model—A machine learning model is a trained computational model that, in some embodiments herein, receives as inputs thermographic image data reflective of feature characteristics, particularly feature non-uniformities, etc. on a substrate prior to or after processing in a device fabrication tool that is to be controlled using information computed by the machine learning model. In some embodiments, the technique used to collect the thermographic image may also be provided as an input. Examples of types of machine learning models include random forests models, including deep random forests, neural networks, including recurrent neural networks and convolutional neural networks, restricted Boltzmann machines, recurrent tensor networks, and gradient boosted trees. Machine learning models are trained using a training set that reflects a range of conditions for which the model should be able to accurately predict appropriate settings for a device fabrication tool. In some embodiments herein, a machine learning model is trained using (i) thermographic images of a substrate that is to be processed using a particular device fabrication tool, (ii) one or more processing parameters for processing the substrate in the device fabrication tool, and (iii) characteristics of the features after the substrate has been processed in the device fabrication tool using the one or more processing parameters.

In the art, some machine learning models are characterized as "deep learning" models. Unless otherwise specified, any reference to "machine learning" herein includes deep learning embodiments. A deep learning model may be implemented in various forms such as by a neural network (e.g., a convolutional neural network), etc. In general, though not necessarily, it includes multiple layers. Each such layer includes multiple processing nodes, and the layers process in sequence, with nodes of layers closer to the model input layer processing before nodes of layers closer to the model output. In various embodiments, one layers feeds to the next, etc. The output layer may include one or more nodes that represent a property of a substrate or a processing parameter that is predicted to achieve a target feature value. In some implementations, a deep learning model is a model that takes data with very little preprocessing and outputs a substrate property or processing parameter.

The nodes and connections of a deep learning model can be trained and retrained without redesigning their number, arrangement, interface with inputs, etc.

Introduction and Context

Although it is generally desired that wafer processing operations apply with uniform effect consistently across the entire surface of every wafer that is processed, such uniformity, of course, is not a reality. Reduction of within wafer non-uniformity (WiWNU) and wafer to wafer (W2W) variation, as well as other forms of non-uniformity, is required for advanced technology nodes. Upstream variation resulting in incoming variation is a major contributor for non-uniformity and yield loss across the wafer and between wafer runs. In some cases, non-uniformities may be anticipated to result from subsequent (downstream) processing operations. It is thus the task of the process engineer to devise effective strategies for dealing with processing nonuniformity—either, in the first instance, by preventing or minimizing it, or otherwise by compensating for it after it occurs, in some cases, at multiple stages of a processing workflow. It requires advanced process control (APC). One method to reduce variation is to obtain optical metrology data of a wafer, derive geometric features or layer compositions from the optical metrology data, and use the derived features and compositions to determine processing parameters. However, the derived features and compositions may be inaccurate approximations. Further, the time to acquire such information reduces throughput, which is undesirable.

Another method to reduce the variation noted above is utilizing incoming wafer information obtained via a thermographic image and a feed forward (FF) model to directly predict a processing parameter behavior and provide a recommendation per wafer. Such a model employs thermographic images from pre-processed substrates as inputs. Through a machine learning prediction, a model will recommend processing parameters for a particular wafer to then be applied by the process chamber to reduce non-uniformity such as WiWNU. In some embodiments, the machine learning prediction simply provides process parameter values, notably temperature values for positions on pedestal, that promote processing to achieve some target level of feature characteristic such as critical dimension, etch depth, pitch, etc. Setting this target level, which is effective across all features on the wafer, intrinsically promotes uniformity.

In some embodiments, thermographic imaging and associated computational technique (e.g., a machine learning model) predicts properties of the substrate, such as layer thickness or critical dimension sizes, such as line CD or depth. In some embodiments a thermographic image provides information on surface features, for example information relevant to a surface layer's thickness, etch feature geometrical properties, etc. In some embodiments, a thermographic image provides information about layers below the surface layer. For example, an image may provide details of layers that are one, two, or more layers below the surface layer. Such details of non-surface layers may include layer thickness. In one example, a post processing nonuniformity may be dominated by variation in the thickness of a single layer film across the wafer, and that layer need not be a surface layer. In some embodiments, a thermographic image and associated computational analysis reveals that the non-uniformity is due to non-uniformity in a subsurface layer.

In certain embodiments, a thermographic image may be analyzed to determine layer thickness, line width or critical dimension, feature depth, and feature aspect ratio. Furthermore, in some embodiments, a thermographic image may be analyzed to provide information regarding the composition of a layer, such as hydrogen content, carbon layer microstructures (sp2 v. sp3 bonding), or amounts of dopants (e.g., phosphorus, boron, and/or arsenic) in silicon films.

In some such embodiments, the thermographic imaging and computational technique function as a metrology tool for predicting any one or more of these properties.

The disclosed techniques provide fast, inexpensive wafer nonuniformity collection: thermographic metrology may act as a replacement for small region (e.g., single device) metrology techniques such as optical metrology (e.g., OCD), electron microscopy, or x-ray spectroscopy. These techniques use expensive equipment, are not necessarily reliable, can destroy devices, and require multiple readings to get wafer level nonuniformity information, which takes time and impacts throughput. By contrast, a thermographic image can provide a single image capture operation that provides a single image having information about the entire wafer and hence wafer level nonuniformity.

Because a thermographic image can be obtained in a single image capture operation and does not take much time, images can be frequently taken and corresponding process chamber adjustments can be made frequently. In some implementations a thermographic image is taken for each production wafer. In some embodiments a thermographic image may be taken at least once per batch, at least once for every ten wafers, at least once for every five wafers, at least once for every two wafers, at least once per hour, etc. In some embodiments, capturing and/or using thermographic images has little or no negative impact on wafer processing throughput.

FIG. 1 is a process flow diagram 101 showing relevant operations of methods of using thermographic images of an incoming wafer to process the wafer. Prior to a fabrication operation, a substrate may be provided in a process chamber. While the description below refers chiefly to semiconductor substrates, the methods may also be applied to layers on other types of substrates including glass substrates on which devices are fabricated.

In operation 100 the wafer is processed by a prior operation. Upstream processing may include lithography, an additive process such as a deposition process and/or a subtractive process such an etch or polishing process. In general, upstream processing may include any sort of processing that would create or modify features on the substrate.

In operation 104, a thermographic image is collected from the wafer. A thermographic image may be collected by a tool or module that wafers are automatically provided to, which will collect data before passing the wafers to a next tool. The thermographic image may be collected by one or more of a variety of techniques, as will be discussed further below. The thermographic image intrinsically contains information about features on the wafer surface.

In operation 106, processing parameters are determined from the thermographic image. As will be discussed further below, in various embodiments, the thermographic image is provided to a machine learning model, which analyzes the thermographic image and outputs processing parameters for a subsequent fabrication operation to be performed on the wafer. In various embodiments, the machine learning model outputs one or more wafer processing parameters, notably a temperature distribution on wafer pedestal or chuck surface for the subsequent fabrication operation.

The machine learning model is trained (or more generally a transfer function is developed) to analyze thermographic images of a wafer to determine processing parameters for that wafer. As will be discussed further below, the machine learning model is first trained using a training set comprising thermographic images, process parameters, and post-processed features for a number of wafers to determine how processing parameters may affect a wafer having some thermographic image. In some embodiments, the machine learning model will only consider certain processing parameters, i.e., a subset of all process parameters, and will output changes to less than all processing parameters.

In operation 108, the processing parameters are provided or applied to a process chamber that will perform a fabrication operation on the partially processed wafer.

In operation 112, the partially processed wafer is processed in the process chamber according to the processing parameters. The fabrication operation may be any of the types discussed elsewhere herein, such as an etch process, a deposition process, or a patterning process. In some embodiments, the processing parameters are temperature values (or thermal flux values) for various locations on a wafer or for various heating (or cooling) elements on a pedestal or chuck that holds the wafer during processing. In certain embodiments, the adjustable process parameters (as determined by the machine learning model) are determined for each wafer before it is input into the process chamber. In some cases, the process parameters other than those adjusted based on a determination by the machine learning model remain the same for each wafer. Because thermographic imaging is a fast and inexpensive way to assess the condition of a wafer, it may be applied to many or all wafers being processed by the process chamber, and it may be so applied without a significant cost or throughput hit.

Finally, in operation 114, the wafer may optionally be analyzed again to collect more thermographic image(s). This may be useful if the machine learning model is to receive on-going training. The thermographic image collected after the fabrication operation may be used to determine a degree of non-uniformity such as WiWNU or other characteristic to be improved by using the machine learning model to determine process parameters. This may allow the machine learning model to learn how effective its processing parameters were in achieving the desired target feature value, providing feedback to the machine learning model. However, in some embodiments the wafer is not analyzed after the fabrication operation to determine target feature values and may instead be directly processed by another fabrication tool.

Figure 2:
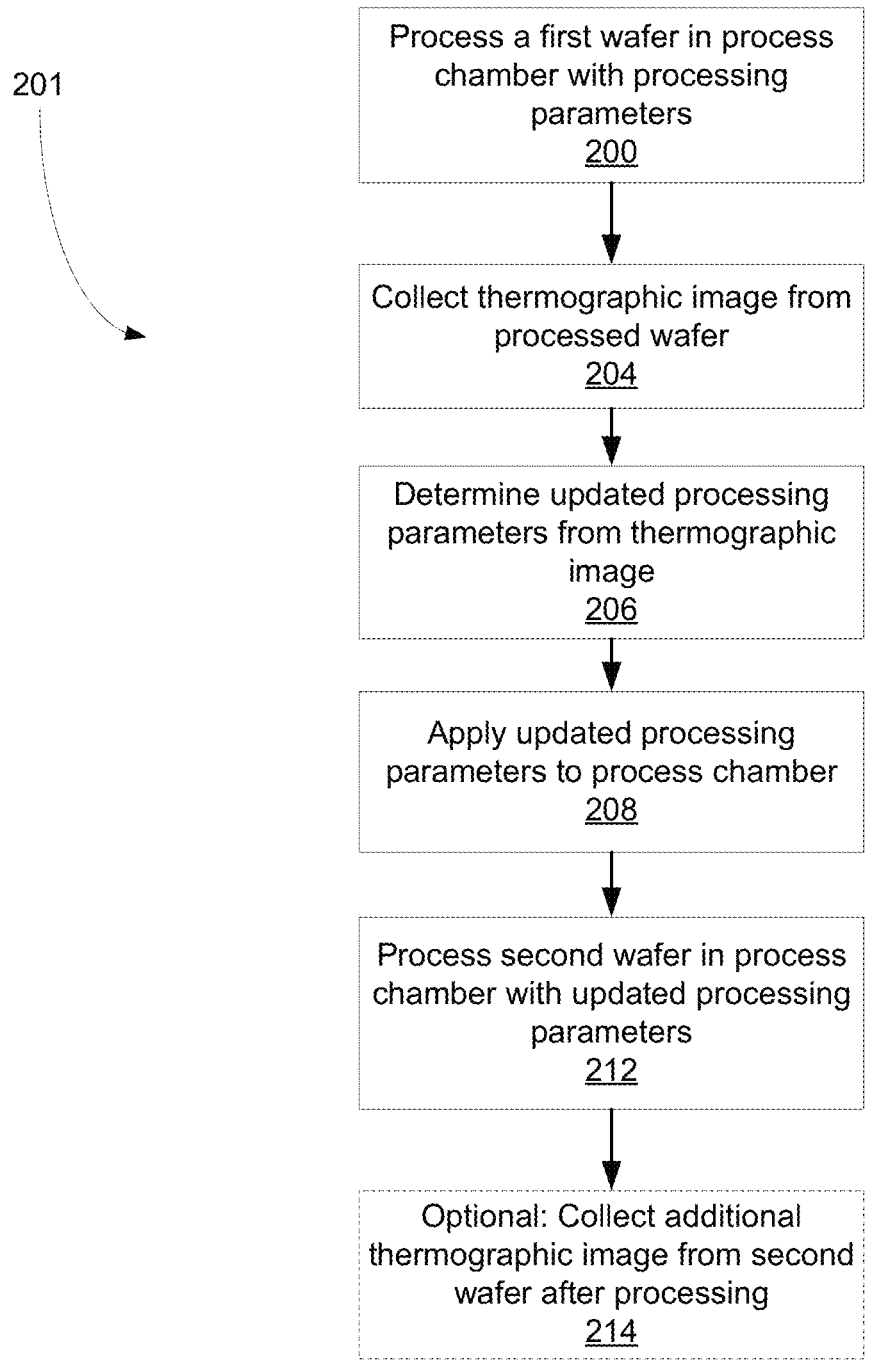

FIG. 2 is a process flow diagram 201 showing relevant operations of methods of using thermographic images from a processed wafer to update processing parameters for a following wafer. While FIG. 1 described a feedforward process flow, where thermographic image is collected before processing a wafer to determine processing parameters for that wafer, FIG. 2 describes a feedback process flow.

In operation 200 a first wafer is processed in a process chamber according to processing parameters. The processing parameters may be any processing parameters as discussed herein, such as temperature values for various heating (or cooling) elements on a pedestal or chuck that holds the wafer during processing.

In operation 204, a thermographic image is collected from the first wafer. A thermographic image may be collected by a tool that wafers are automatically provided to, which will collect data before passing the wafers to a next tool. The thermographic image may be collected by one or more of a variety of techniques, as will be discussed further below. The thermographic image intrinsically contains information about features on the first wafer surface or about subsurface layers. Thermographic imaging may be applied to many or all wafers being processed by the process chamber.

In operation 206, updated processing parameters are determined from the thermographic image of the first wafer. The thermographic image may be provided to a machine learning model that analyzes the thermographic image and outputs updated processing parameters for subsequent fabrication operations to be performed on subsequent wafers.

In operation 208, the processing parameters are provided or applied to a process chamber that will perform a fabrication operation on the partially processed wafer.

In operation 212, a second wafer is processed in the process chamber according to the updating processing parameters. The fabrication operation may be any of the types discussed elsewhere herein, such as an etch process, a deposition process, or a patterning process. In some embodiments, the updated processing parameters are temperature values (or thermal flux values) for various locations on a wafer or for various heating (or cooling) elements on a pedestal or chuck that holds the wafer during processing.

Finally, in operation 214, the second wafer may optionally be analyzed again to collect more thermographic image(s). This may be useful if the machine learning model is to receive on-going training. The thermographic image collected after the fabrication operation may be used to determine a degree of non-uniformity such as WiWNU or other characteristic to be improved by using the machine learning model to determine process parameters. This may allow the machine learning model to learn how effective its processing parameters were in achieving the desired target feature value, providing additional feedback to the machine learning model. However, in some embodiments the second wafer is not analyzed after the fabrication operation to determine target feature values and may instead be directly processed by another fabrication tool.

Figure 3:
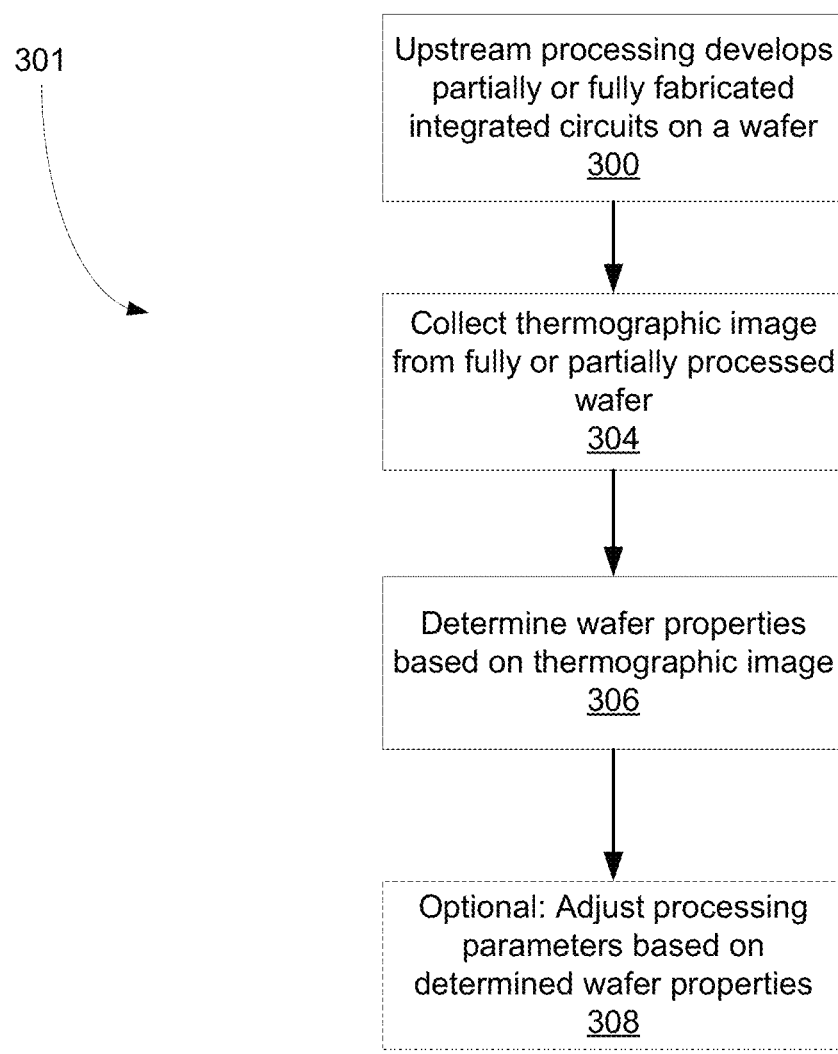
FIG. 3 presents a flow diagram of a process for determining properties of a substrate for one example embodiment.

FIG. 3 is a process flow diagram 301 showing relevant operations of methods of using thermographic images of a wafer to determine properties of the wafer. While FIGS. 1 and 2 describe determining processing parameters from a thermographic image of a wafer, a thermographic image may also be used to determine features of a wafer as a form of metrology. such as thickness of a thin film. In some embodiments, the IR radiation intensity values of the thermographic image are calibrated against a metrology reference or input to a machine learning model to identify metrology measurements, e.g., film thickness or a critical dimension (CD).

In operation 300 the wafer is processed by a prior operation. Upstream processing may include lithography, an additive process such as a deposition process and/or a subtractive process such an etch or polishing process. In general, upstream processing may include any sort of processing that would create or modify features on the substrate. In some embodiments the substrate is partially processed, such that additional processing operations may be performed. In other embodiments, the substrate includes fully fabricated integrated circuits.

In operation 304, a thermographic image is collected from the wafer. A thermographic image may be collected by a metrology tool that wafers are automatically provided to. The thermographic image may be collected by one or more of a variety of techniques, as will be discussed further below. The thermographic image intrinsically contains information about features on the wafer surface.

In operation 306 properties of the wafer are determined from the thermographic image. The thermographic image may be provided to a machine learning model or a transfer function, which analyzes the thermographic image and outputs features or properties of the wafer. As noted above, the properties of the wafer may include film thickness, space/line CD, and depth.

Finally, operation 308 is an optional operation where processing parameters for a fabrication operation may be adjusted or determine based on the determined wafer properties. This operation may be performed similarly to operations 106 and 206, above. In some embodiments, however, rather than inputting the thermographic image to a model, the wafer properties are used as input. This may be useful for systems that take specific wafer properties as input, and may not be able to take the thermographic image as an input. For example, some systems may determine processing parameters based on feature geometries, such as line width or depth. A thermographic image may be used, potentially with other information, to determine feature geometries that are usable by such systems.

Figure 4:
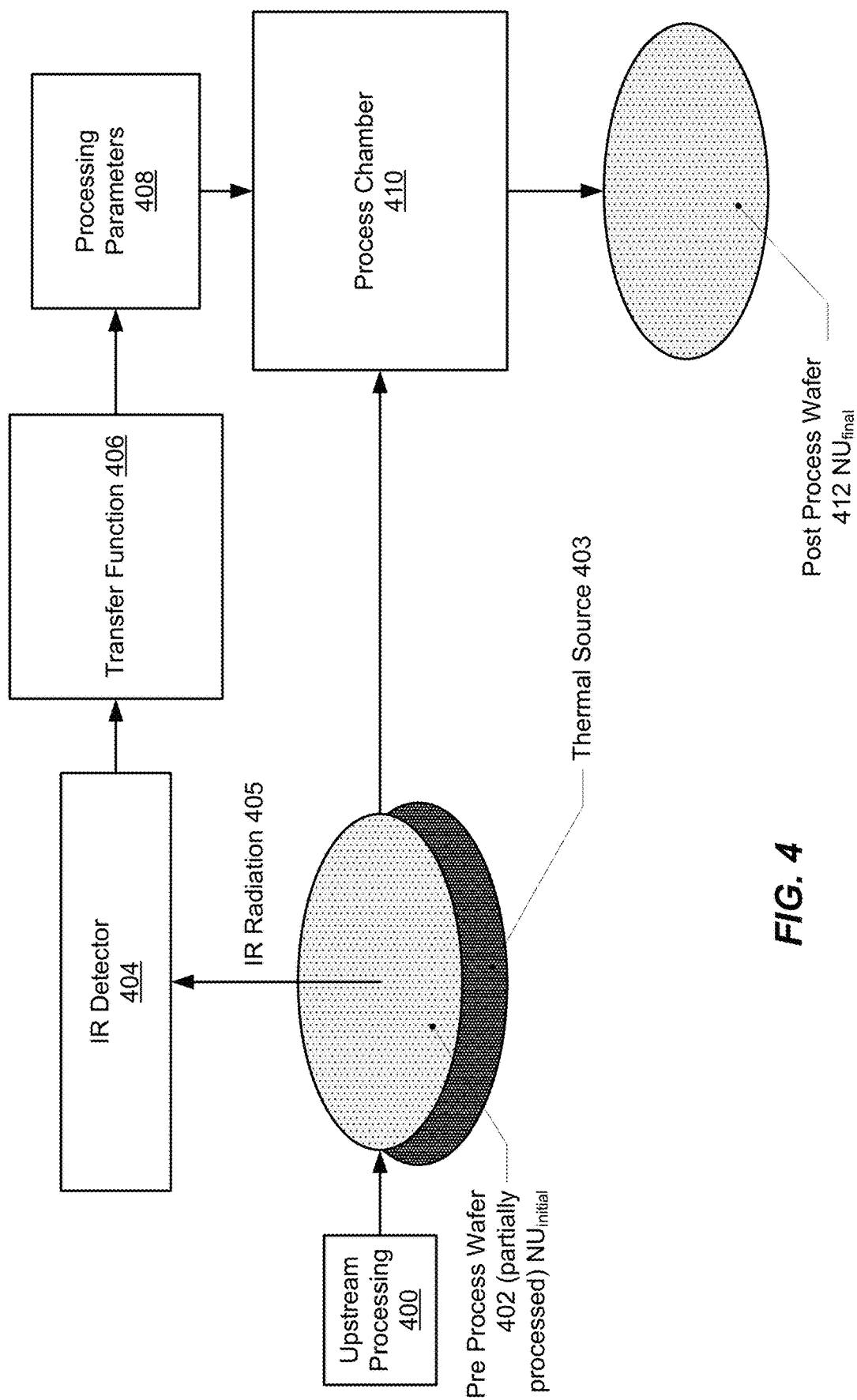
FIG. 4 presents a block diagram of subsystems and information that may be used to implement certain automated non-uniformity corrective processes.

FIG. 4 is a diagram showing relevant components or subsystems of an electronic device fabrication processing segment that uses thermographic images to capture information about features of a partially processed wafer. The thermographic image is used by a machine learning model to define process parameters for a subsequent process performed on the wafer (or, in the case of FIG. 2, a different wafer). Upstream processing module(s) 400 represents one or more pieces of manufacturing equipment that produce the features of the partially processed wafer. Module(s) 400 may be any one or combination of manufacturing equipment such etch, deposition, lithography, ashing, polishing, etc. equipment. The result of the upstream processing by the module (s) 400 is a pre-process wafer 402, which has been partially processed. Pre-process wafer 402 may have a variety of features which are characterized at various locations on the wafer by a thermographic image. Pre-process wafer 402 also has an initial feature non-uniformity (e.g., variations in an average feature CD from die to another), which may be determined by analyzing thermographic image data collected from the wafer.

A thermographic metrology system having an Infrared (IR) detector and a thermal source 403 analyzes incoming wafers and collects a thermographic image. IR detector 404 may analyze pre-process wafer 402 using one or more techniques described herein to collect a thermographic image of the wafer. An advantage of IR detection is that data may be collected relatively quickly, allowing a large number of wafers to be analyzed without a significant decrease of throughput for the fabrication process, as compared to other forms of metrology, such as those that employ incident x-ray radiation or electrons. IR radiation intensity values collected by IR detector 404 may comprise various signals received from the wafer. In some embodiments, IR detector 404 is an integrated metrology tool, in that it is physically integrated with manufacturing equipment such as one or more upstream modules or the process chamber 410. An integrated metrology tool may directly collect IR data from incoming wafers, and pass wafers to the process chamber and also pass the IR data to a model or transfer function.

The data collected by the IR detector 404 is provided to a transfer function 406. In some embodiments, the transfer function 406 is a machine learning model. The machine learning model may be a trained algorithm that takes the thermographic image, a target feature value, such as a desired feature dimension (e.g., CD, pitch, and/or depth), and outputs a processing parameter 408. In some embodiments the machine learning model outputs a single value for the fabrication operation, such as a time duration, or a plurality of outputs, such as a plurality of temperature values. In some embodiments the machine learning model outputs multiple processing parameters.

The system also includes a process chamber 410. The process chamber 410 performs a fabrication operation on the pre-processed wafer 402 using the processing parameters 408. In some embodiments, the only processing parameter that changes between fabrication operations on wafers is the temperature distribution. In other embodiments, other processing parameters discussed herein may be adjusted between fabrication operations.

As illustrated, the process chamber 410 produces a post-process wafer 412 having features resulting from the processing parameter 408. The post-process wafer 412 has a final non-uniformity, which may be reduced in comparison to that of the pre-processed wafer 402 or of a similar wafer processed without using the embodiments discussed herein. As indicated, the uniformity improvement may be due to setting the same target input value for each site (or a collection of sites) on the wafer or the devices supporting the wafer. If the machine learning model accurately captures the relationship between pre- and post-processing feature values and a processing parameter, such as a temperature value, the processed wafer should have approximately the target feature value at each site. In some implementations, the variability of target feature values across all sites may also be reduced. Optionally, in some embodiments, the post-process wafer 412 is analyzed by a metrology tool (optionally the same metrology tool, i.e. an IR detector, used to analyze the pre-processed wafer) to verify if the target feature value has been reached and provide additional data to improve the machine learning model.

Processing Parameters

Processing parameters control the operation of manufacturing equipment such as an etcher. Processing parameters may be determined or set by various operations, such as by using machine learning models as described herein. In some cases, some of the processing parameters for a process reactor are determined by a machine learning model but other process parameters are determined by other means. For example, in some embodiments, the machine learning model outputs a temperature distribution (or typically individual temperature values for various sites of a pedestal) to be used as a processing parameter. Additional processing parameters, which the machine learning model may or may not output, may include a time duration of a process operation, height of an edge ring surrounding the substrate, pressure of the process chamber, flow rate of process gas, composition of process gas, plasma characteristics including, optionally, power density, frequency, bias on a pedestal, duty cycle, RF power, etc.

In some embodiments, the processing parameters include location specific parameters: showerhead gas flow, plasma distribution, and temperature distribution. Each of these may vary radially and, in some cases, azimuthally. U.S. Pat. Pub. No. 2017/0133202 (Berry et. al.) is hereby incorporated for the purpose of ways to control a plasma distribution radially and azimuthally for etch and deposition processes.

In some embodiments, the processing parameters include a temperature distribution for a wafer support assembly having radial and azimuthal components. The wafer support assembly may have a plurality of independently controllable temperature control zones arranged in proximity to device die locations above the temperature control zones. U.S. Pat. No. 8,852,964 (Kimura et. al.) is hereby incorporated for the purpose of ways to provide and control a wafer support assembly having a plurality of independently controllable temperature control zones.

Machine Learning Model

As noted above, a machine learning model may be used to provide a processing parameter, such as a temperature distribution, that can be applied for a subsequent fabrication operation on a substrate. In some embodiments, a machine learning model is trained using a set of training substrates. Each training substrate provides data for the training set. That data may include thermographic images collected from the substrate before a training fabrication operation, the spatial location (or site) of each IR radiation intensity value, a target feature value for each spatial location, a processing parameter (e.g. temperature distribution) for the training fabrication operation, and geometric features (e.g., CD values) or thermographic images collected from the substrate after the training fabrication operation. Additional information, such as other processing parameters, may also be included in the data associated with each training substrate. In some embodiments, details of the technique used to collect the thermographic image are included in the data associated with each training substrate, such as the temperature of the substrate or thermal source when a thermographic image is collected.

Specific data is adjusted between training substrates to provide a diverse data set for the machine learning model to train on. For example, a temperature distribution may be changed between otherwise similar training substrates. A machine learning model may then be able to determine the effect of temperature as a processing parameter on a site of the substrate providing a specific optical signal.

Machine learning models are trained using training sets. In accordance with various embodiments, a training set has at least three components: pre-processed substrate feature information, post-processed substrate feature information, and processing parameters for a process of interest that coverts the pre-processed substrate to the post-process substrate. In some cases, the pre-processed substrate feature information is thermographic image data taken from a substrate or, particularly, a position on a substrate prior to its being processed in the process of interest. In certain embodiments, the processing parameters for the process of interest are temperature settings on a pedestal having multiple discrete temperature or heating elements distributed over the face of the pedestal. The post-processed substrate feature information may be, for example, a geometric feature of the processed substrate such as a critical dimension, etch depth, pitch, etc. In some cases, the post-processed substrate feature information is a thermographic image taken from the post-processed substrate. In such cases, the thermographic image contains information about the features on the post-processed substrate.

In certain embodiments, any given member of the training set is provided for a specific location on a substrate. For example, thermographic image data or other pre-processed substrate feature information may be taken at a particular location such as a region within a first die on the substrate. For this training set member, the post-processed feature information is taken from the same location. Further, to the extent that the processing parameters are localized at particular regions of the substrate, the processing parameter is provided at the particular location where the pre- and post-processing feature information is taken, in this case the particular location on the first die of the substrate.

In this approach, the training set members each contain three pieces of information for particular locations on the substrate. To provide a robust training set, training set members are provided for multiple regions of the substrate. And, when multiple training set members are provided for any given location on the substrate, the different training set members will have a different process parameters and/or a different pre-processing feature information.

In certain embodiments, an initial, untrained neural network contains a random set of parameters to be trained or optimized during the training process. These parameters may include weights for connections between nodes or other components of the individual layers of the neural network or other modifiable aspects of the neural network architecture. Training may be conducted using any suitable optimization algorithm such as a stochastic gradient descent technique (e.g., "Adam: A Method for Stochastic Optimization," Kingma &. Ba, published as a conference paper at ICLR 2015, which is incorporated herein by reference in its entirety).

While this disclosure refers to using machine learning models to process thermographic images and output processing parameters or substrate features, in some embodiments a simple conversion of the IR radiation intensity values may be performed. For example, the IR radiation intensity values may be inputs to a relatively simple transfer function that outputs the processing parameter or substrate feature. Such a function may be developed by a technique other than machine learning or other trained modeling techniques. In general, the applications discussed herein for interpreting thermographic image data from wafers may, in some cases, be implemented by transfer functions other than trained models.

Thermographic Metrology

Figure 6:
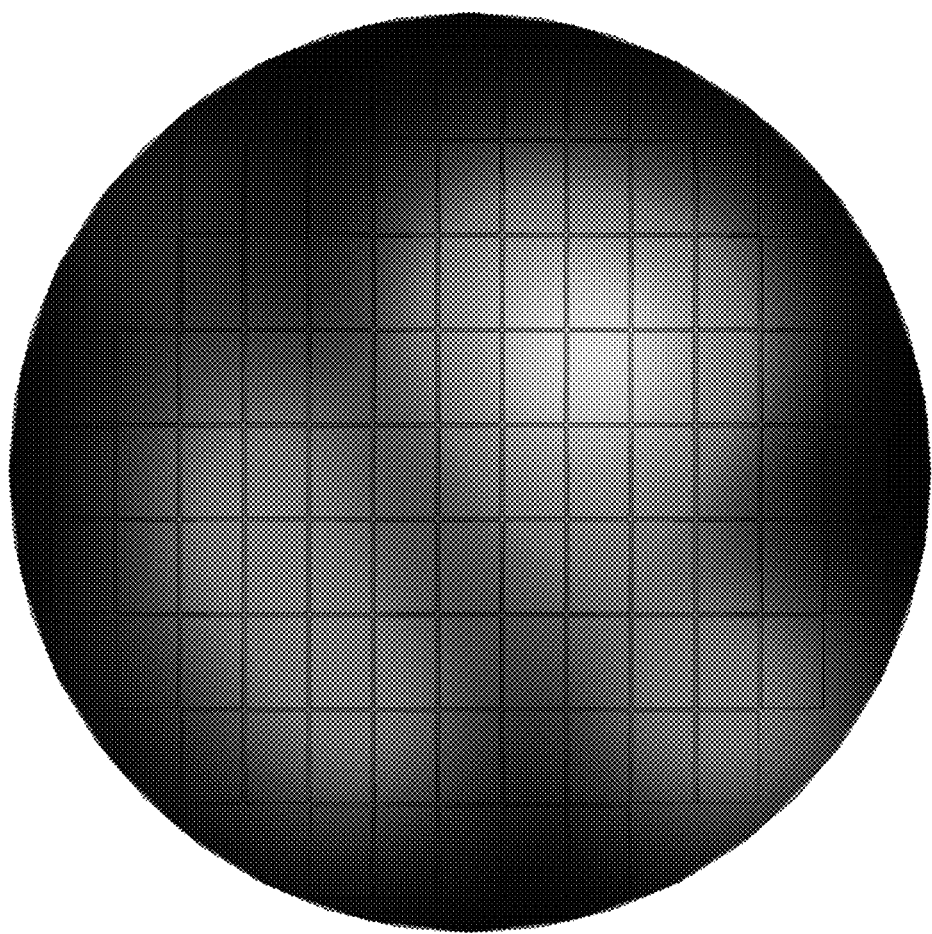
FIG. 6 presents an example thermographic image.

Various embodiments described herein relate to using a thermographic image. A thermographic image is a two-dimensional map of IR radiation intensity values for multiple spatial positions on a wafer. FIG. 6 provides one example of a thermographic image of a wafer. The greyscale gradients shown in FIG. 6 represent the change in IR radiation intensity values across the thermographic image, which may relate to various properties of the wafer from which the thermographic image was collected.

A thermographic image may be collected by various techniques. In some embodiments, a static technique is used, which may generally refer to collecting a thermographic image after a thermal equilibrium is reached, as explained further below. In other embodiments, a dynamic technique is used, where a thermographic image is collected without an equilibrium, for example temporarily exposing a wafer to a thermal source.

While the techniques discussed herein refer to taking thermographic images of the entire surface of the wafer, in some embodiments a thermographic image is taken of less than the entire surface. For example, techniques described herein could be performed on a portion of a wafer and repeated across multiple portions of the wafer. A thermographic image may be taken of each portion and then stitched together to form a composite thermographic image corresponding to multiple portions of the wafer.

Figure 5A:
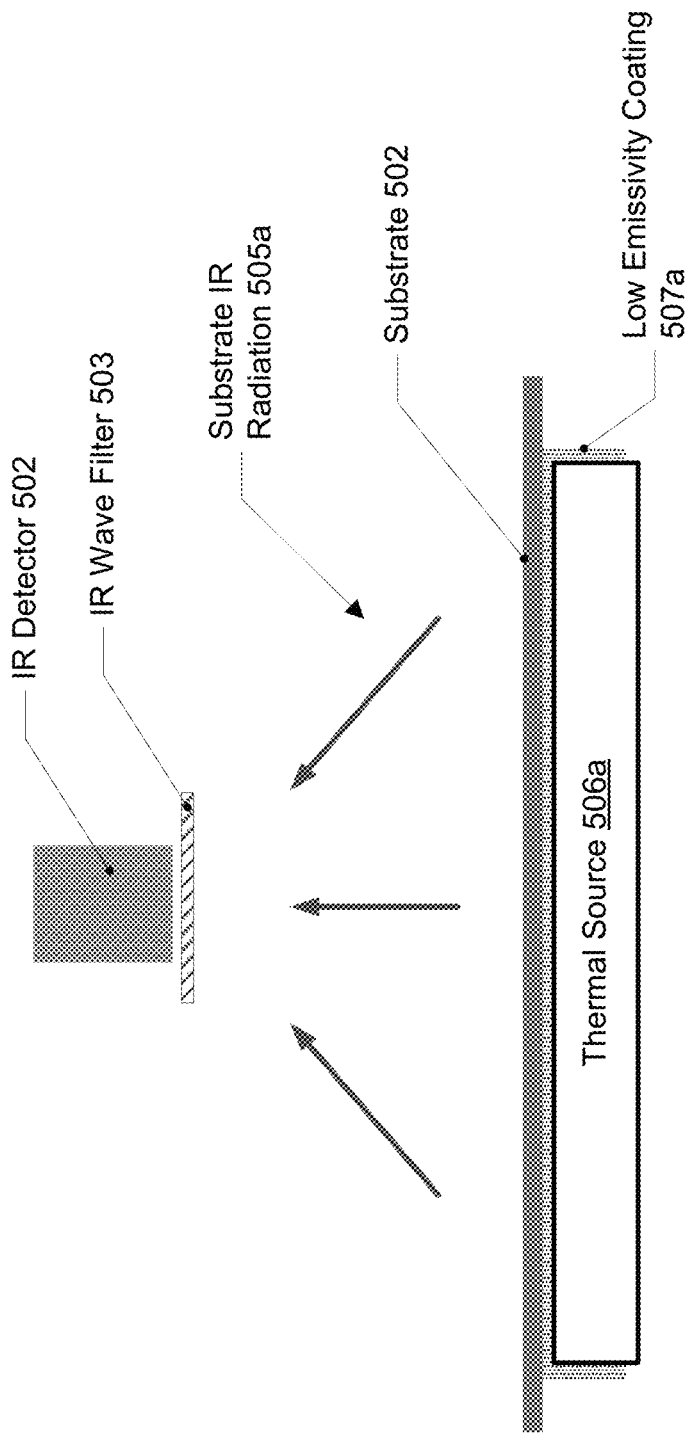
FIG. 5A-B present illustrations of thermographic metrology systems in accordance with various embodiments described herein.
Figure 5B:
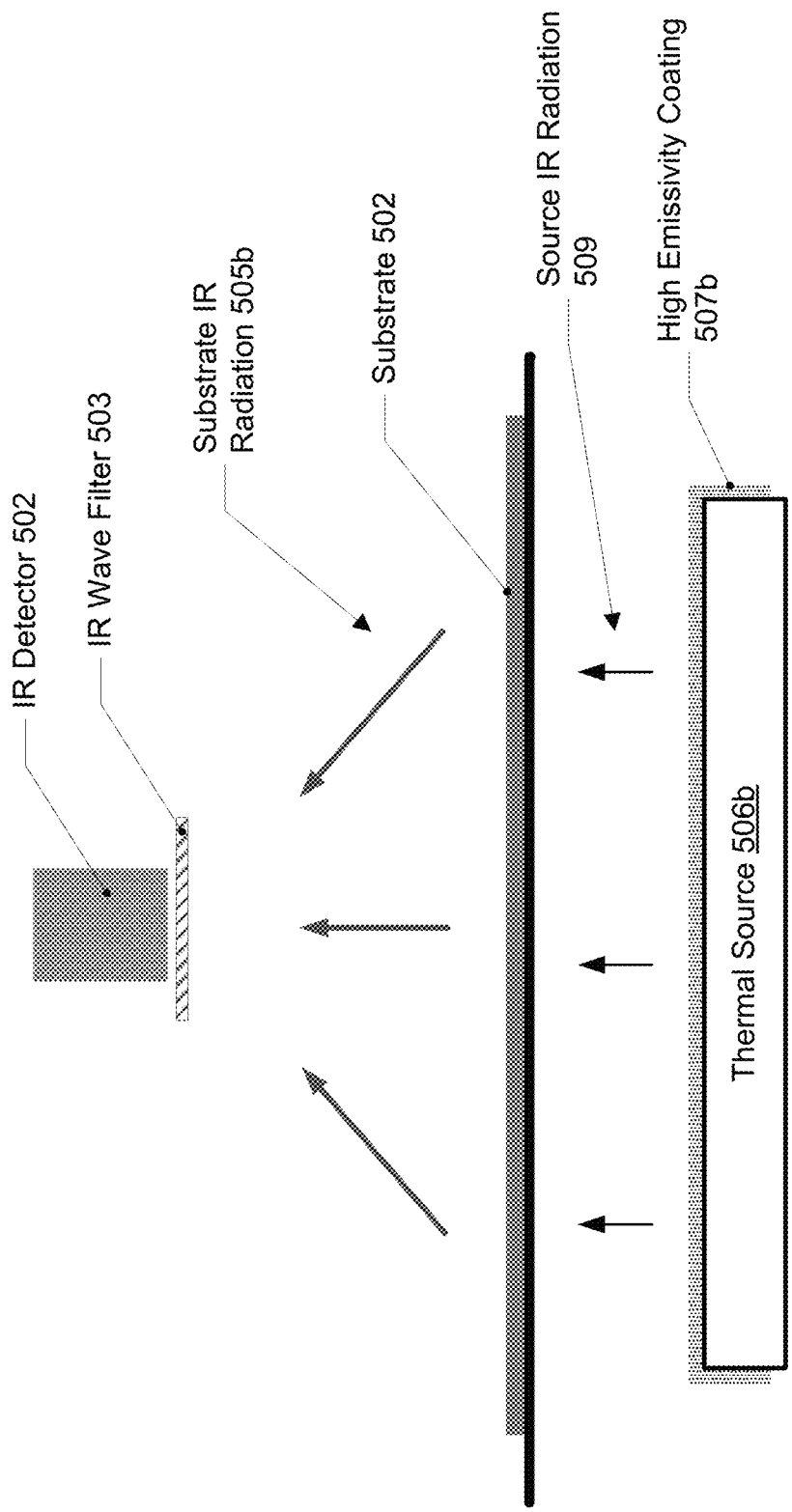

In addition to static and dynamic techniques, a thermographic image may be collected via techniques that focus on collecting IR radiation that is either emitted or transmitted from a wafer. Generally, a thermal source with a low emissivity coating emits substantially no IR radiation, transferring thermal energy via conduction or convection. Conversely, a thermal source with a high emissivity coating may emit a large amount of IR radiation, and in some embodiments using a high emissivity coating the thermal source may be isolated from a substrate to limit thermal energy transfer by conduction or convection. FIGS. 5A and 5B provide two different setups for a thermographic metrology module, or system, having an IR detector and a thermal source. In FIG. 5A, a substrate 501 to be measured is placed on a thermal source 506a that is coated with a low emissivity coating 507a. An IR detector 502 is placed above the wafer and receives substrate IR radiation 508a. In some embodiments, an IR wave filter 503 may be present, which may transmit a specific band of wavelengths for the IR detector to receive, otherwise blocking other wavelengths from the IR detector 502. In some embodiments, the thermal source can be designed or configured to provide radiation over only a particular spectrum of wavelengths. For example, pure silicon is largely transparent in the IR range of the electromagnetic spectrum, so a spectrum for detection or irradiation may be selected such that the pure silicon (i.e. a wafer substrate) is transparent and does not affect the measured intensity values.

During an operation to collect a thermographic image, the thermal source may have a temperature of up to about 300° C. The choice of temperature may depend on the composition of the films on the wafer to be measured; higher temperatures may result in undesirable thermal processing of the wafer. Some techniques as described herein flash the wafer with IR radiation, and in such embodiments thermal processing concerns may be mitigated due to the temporary temperature change as the substrate, or a portion thereof, absorbs and emits IR radiation. In embodiments where the thermal source is not in conductive or convective contact, the thermal source may be at a higher temperature, such as up to about 600° C., with less risk of thermally processing the substrate.

In the system of FIG. 5A, the thermal source emits substantially no IR radiation due to the low emissivity coating 507a. A low emissivity coating is a coating that has an emissivity value that is about 0, such as about 0.02. The substrate may be heated by the thermal source via conduction and/or convection and act as an emitter, emitting substrate radiation 508a. In some embodiments the substrate is placed in direct physical contact with the thermal source, while in other embodiments a conductive medium may be placed between the thermal source and the substrate. The radiation received by the IR detector 502 may thus be substantially only from the substrate 501. Based on the substrate IR radiation 508a received by the IR detector 502, a thermographic image may be created that reflects the IR radiation values emitted by the substrate.

In some embodiments, a static technique is performed using the system of FIG. 5A. In a static technique, the thermal source is set to a specific temperature and a thermographic image is collected after sufficient time for the substrate to reach thermal equilibrium with the thermal source. Generally, static techniques are not time dependent, but may rely on the substrate reaching a thermal equilibrium with the thermal source. The IR detector is pointed at the top (patterned) surface of the substrate and an image is taken. The IR radiation received by the detector substantially comprises emissions from the substrate, as the low emissivity coating blocks the thermal source from radiating. The various material/structural property differences in the wafer's layers (density, thickness, emissivity, CD, etc.) lead to contrast in the captured image. Fluctuations in these contrasts across the wafer may be the result of nonuniformities.

A different static technique that may be performed using the system of FIG. 5A involves the thermal source having a coating that emits some IR radiation, such as a coating having an emissivity between 0 and 1. Rather than a low emissivity coating, where the thermal source may emit substantially no IR radiation, the thermal would emit some amount of IR radiation. The IR radiation emitted by the thermal source would transmit through the substrate, being absorbed and transmitted by the substrate. This transmitted IR radiation would be in addition to the IR radiation emitted by the substrate due to conduction and/or convection with the thermal source. The IR detector would thus receive, in addition to IR radiation emitted by the substrate itself, IR radiation emitted by the thermal source and transmitted by the substrate. A thermographic image may then be created based on the detected IR radiation. The absorption/transmission of IR radiation by the substrate may then be used, along with the IR radiation emitted by the substrate, are included in the thermographic image.

It should be noted that transmission of IR radiation, in the context of thermographic metrology as discussed herein, refers to IR radiation that is transmitted through the substrate, rather than being absorbed by the substrate. Principally, this will refer to IR radiation from a source that is directed through the substrate to be imaged. While transmitted IR radiation is radiation that passes through the substrate, "emitted IR radiation" is IR radiation emitted by a substrate or thermal source due to its own thermal energy, rather than absorption or transmission of IR radiation from a separate source.

In the system of FIG. 5B, the thermal source emits substantially IR radiation due to a high emissivity coating 507b. A high emissivity coating is a coating that has an emissivity value of about 1, such as about 0.99. The substrate may be physically isolated from the thermal source to substantially eliminate conductive or convective heating of the substrate. This may be accomplished by various means, such as placing the substrate on an IR transparent surface above the thermal source. The substrate acts as an absorber and transmitter, receiving source IR radiation 505 and transmitting substrate radiation 508b. The radiation received by the IR detector 502 may thus be affected by the absorption and transmission by substrate 501. Based on the substrate IR radiation 508b received by the IR detector 502, a thermographic image may be created that corresponds to the IR radiation values emitted from the thermal source 506b and transmitted by the substrate.

In some embodiments, a static technique is performed using the system of FIG. 5B. In a static technique, the thermal source is set to a emit consistent source IR radiation and a thermographic image is collected after sufficient time for the substrate to reach an absorption/transmission equilibrium with the thermal source. Generally, static techniques are not time dependent, such that the exact timing of capturing the thermographic image does not affect the IR radiation intensity values. The IR detector is pointed at the top (patterned) surface of the substrate and an image is taken. The various material/structural property differences in the wafer's layers (density, thickness, emissivity, CD, etc.) lead to contrast in the captured image. Fluctuations in these contrasts across the wafer may be the result of nonuniformities.

In some embodiments, a dynamic technique is performed using the system of either FIG. 5A or FIG. 5B. Dynamic techniques may be performed with either a low emissivity coating or a high emissivity coating, or a coating having some other emissivity. In a dynamic technique, thermographic images are collected without thermal equilibrium. For example, the substrate may be flashed with a thermal source (either the whole wafer or in sections), and a thermographic image is collected during or after the flash. In some embodiments multiple thermographic images are taken during and/or after the flash. In some embodiments flashing may include increasing or decreasing the temperature of the thermal source relative to the substrate. In other embodiments flashing may include exposing the substrate to a thermal source for an amount of time that is insufficient to allow for thermal equilibrium between the substrate and the thermal source, such as a laser or IR LED bulb. The IR radiation from the substrate after flashing will be impacted by the change in temperature of the substrate, dependent on the materials and geometries of the stack on the wafer. This will affect the IR radiation intensity values of the thermographic image, thus permitting various insights into nonuniformities across the wafer. In embodiments involving multiple thermographic images being taken during and/or after flashing, the change in IR radiation intensity values between each thermographic image, and in some embodiments the rate of change of IR radiation intensity values, can be used to infer properties of the substrate by inputting them to a model.

Example

The following example is provided to further illustrate aspects of various embodiments. This example is provided to exemplify and more clearly illustrate aspects and is not intended to be limiting.

Figure 7:
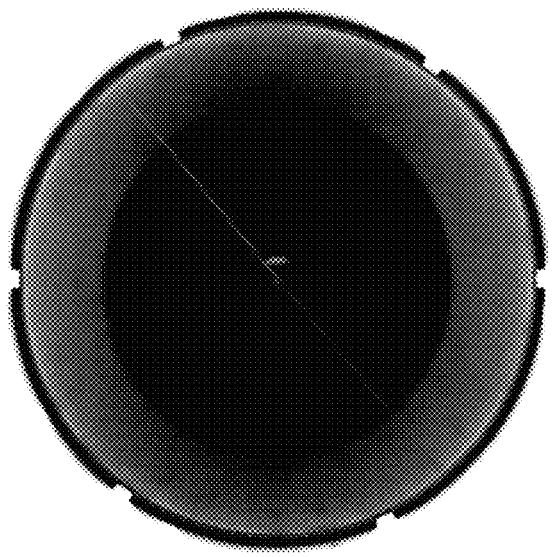
FIG. 7 presents different illustrations of an example thermographic image, each illustration having a different gradient scaling to highlight non-uniformities.
Figure 7:
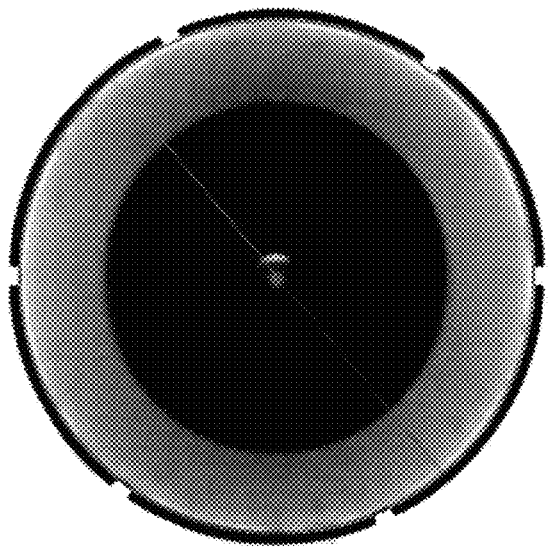
Figure 7:
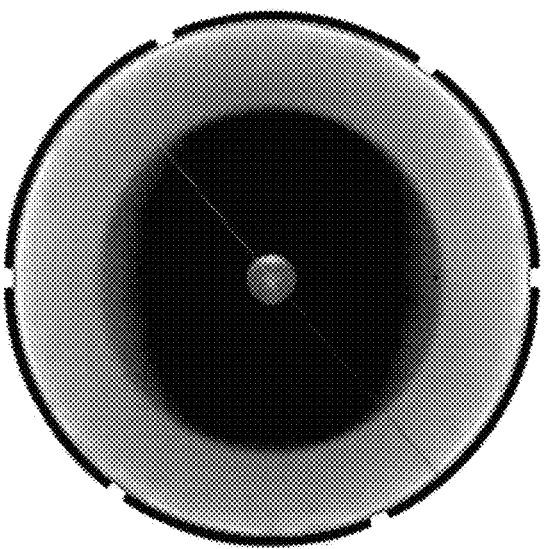

FIG. 7 provides an example of a thermographic image that may be collected from a partially processed wafer. Each of IR images 700a-c are the same thermographic image; the gradient scale has been adjusted to visually distinguish non-uniformities of the wafer. The elliptical gradients illustrated in IR images 700a-c indicate non-uniformities of the partially processed wafer. Depending on the embodiment, these images may be used to adjust processing parameters for a prior or subsequent fabrication operation. Notably, the black circle in the middle was caused by a non-optimized setup, resulting in artifacts in the central portion of the image not caused by the wafer itself, e.g. from a reflective surface.

Apparatus

Figure 8:
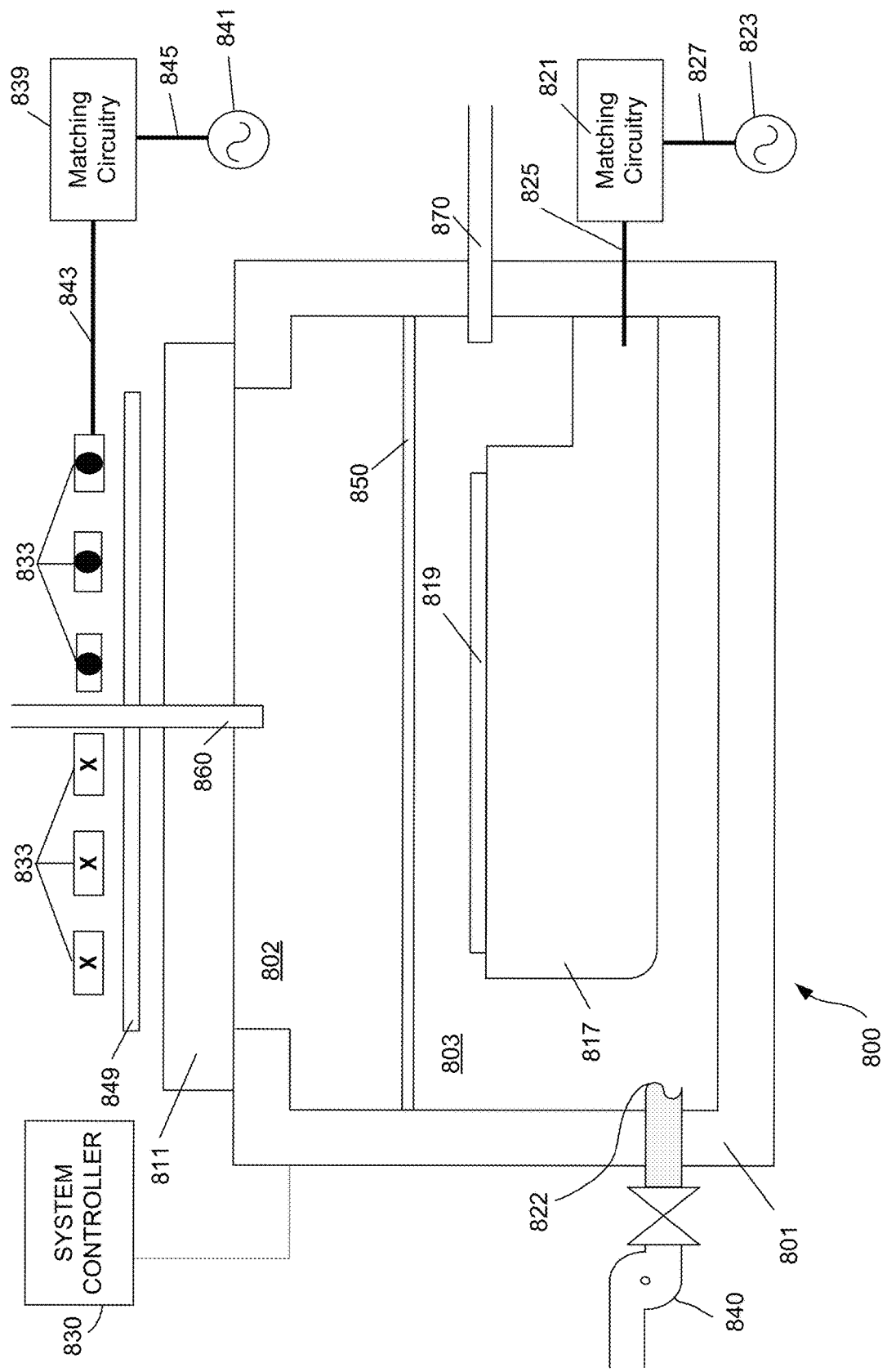
FIGS. 8 and 9A-C are schematic diagrams of examples of process chambers for performing methods in accordance with disclosed embodiments.

FIG. 8 schematically shows a cross-sectional view of an inductively coupled plasma etching apparatus 800 in accordance with certain embodiments herein. A Kiyo™ reactor, produced by Lam Research Corp. of Fremont, Calif., is an example of a suitable reactor that may be used to implement the techniques described herein. The inductively coupled plasma etching apparatus 800 includes an overall etching chamber structurally defined by chamber walls 801 and a window 811. The chamber walls 801 may be fabricated from stainless steel or aluminum. The window 811 may be fabricated from quartz or other dielectric material. An optional internal plasma grid 850 divides the overall etching chamber into an upper sub-chamber 802 and a lower sub-chamber 803. The plasma grid 850 may include a single grid or multiple individual grids. In many embodiments, plasma grid 850 may be removed, thereby utilizing a chamber space made of sub-chambers 802 and 803.

A chuck 817 is positioned within the lower sub-chamber 803 near the bottom inner surface. In some embodiments, the chuck 817 is a wafer support assembly including a plurality of independently controllable temperature control zones, as discussed above. The chuck 817 is configured to receive and hold a semiconductor wafer 819 upon which the etching process is performed. The chuck 817 can be an electrostatic chuck for supporting the wafer 819 when present. In some embodiments, an edge ring (not shown) surrounds chuck 817, and has an upper surface that is approximately planar with a top surface of a wafer 819, when present over chuck 817. The chuck 817 also includes electrostatic electrodes for chucking and dechucking the wafer. A filter and DC clamp power supply (not shown) may be provided for this purpose. Other control systems for lifting the wafer 819 off the chuck 817 can also be provided. The chuck 817 can be electrically charged using an RF power supply 823. The RF power supply 823 is connected to matching circuitry 821 through a connection 827. The matching circuitry 821 is connected to the chuck 817 through a connection 825. In this manner, the RF power supply 823 is connected to the chuck 817.

A coil 833 is positioned above window 811. The coil 833 is fabricated from an electrically conductive material and includes at least one complete turn. The exemplary coil 833 shown in FIG. 8 includes three turns. The cross-sections of coil 833 are shown with symbols, and coils having an "X" extend rotationally into the page, while coils having a "●" extend rotationally out of the page. An RF power supply 841 is configured to supply RF power to the coil 833. In general, the RF power supply 841 is connected to matching circuitry 839 through a connection 845. The matching circuitry 839 is connected to the coil 833 through a connection 843. In this manner, the RF power supply 841 is connected to the coil 833. An optional Faraday shield 849 is positioned between the coil 833 and the window 811. The Faraday shield 849 is maintained in a spaced apart relationship relative to the coil 833. The Faraday shield 849 is disposed immediately above the window 811. The coil 833, the Faraday shield 849, and the window 811 are each configured to be substantially parallel to one another. The Faraday shield may prevent metal or other species from depositing on the dielectric window of the plasma chamber.

Process gases may be supplied through a main injection port 860 positioned in the upper chamber and/or through a side injection port 870, sometimes referred to as an STG. A vacuum pump, e.g., a one or two stage mechanical dry pump and/or turbomolecular pump 840, may be used to draw process gases out of the process chamber and to maintain a pressure within the process chamber 800 by using a closed-loop-controlled flow restriction device, such as a throttle valve (not shown) or a pendulum valve (not shown), during operational plasma processing.

During operation of the apparatus, one or more reactant gases may be supplied through injection ports 860 and/or 870. In certain embodiments, gas may be supplied only through the main injection port 860, or only through the side injection port 870. In some cases, the injection ports may be replaced by showerheads. The Faraday shield 849 and/or optional grid 850 may include internal channels and holes that allow delivery of process gases to the chamber. Either or both of Faraday shield 849 and optional grid 850 may serve as a showerhead for delivery of process gases.

Radio frequency power is supplied from the RF power supply 841 to the coil 833 to cause an RF current to flow through the coil 833. The RF current flowing through the coil 833 generates an electromagnetic field about the coil 833. The electromagnetic field generates an inductive current within the upper sub-chamber 802. The physical and chemical interactions of various generated ions and radicals with the wafer 819 selectively etch features of the wafer.

If the plasma grid 850 is used such that there is both an upper sub-chamber 802 and a lower sub-chamber 803, the inductive current acts on the gas present in the upper sub-chamber 802 to generate an electron-ion plasma in the upper sub-chamber 802. The optional internal plasma grid 850, if present, may act to limit the number of hot electrons in the lower sub-chamber 803. In some embodiments, the apparatus is designed and operated such that the plasma present in the lower sub-chamber 803 is an ion-ion plasma. In other embodiments, the apparatus may be designed and operated such that the plasma present in the lower sub-chamber 803 is an electron-ion plasma. Internal plasma grids and ion-ion plasma are further discussed in U.S. patent application Ser. No. 14/082,009, filed Nov. 15, 2013, and titled "INTERNAL PLASMA GRID FOR SEMICONDUCTOR FABRICATION," and in U.S. Pat. No. 9,245,761, each of which is herein incorporated by reference in its entirety.

Volatile etching byproducts may be removed from the lower-sub chamber 803 through port 822. The chuck 817 disclosed herein may operate at elevated temperatures ranging between about 30° C. and about 250° C. In some cases, the chuck 817 may also operate at lower temperatures, for example when the chuck 817 is actively chilled. In such cases the chuck 817 may operate at substantially lower temperatures, as desired. The temperature will depend on the etching process operation and specific recipe. In some embodiments, the chamber 801 may operate at pressures in the range of between about 1 mTorr and about 95 mTorr. In certain embodiments, the pressure may be higher.

Chamber 801 may be coupled to facilities (not shown) when installed in a clean room or a fabrication facility. Facilities include plumbing that provide processing gases, vacuum, temperature control, and environmental particle control. These facilities are coupled to chamber 801, when installed in the target fabrication facility. Additionally, chamber 801 may be coupled to a transfer chamber that allows robotics to transfer semiconductor wafers into and out of chamber 801 using typical automation.

In some embodiments, a system controller 830 (which may include one or more physical or logical controllers) controls some or all of the operations of an etching chamber. The system controller 830 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the system controller 830 or they may be provided over a network. In certain embodiments, the system controller 830 executes system control software.

In some cases, the system controller 830 controls gas concentration, wafer movement, and/or the power supplied to the coils 833 and/or electrostatic chuck 817. The system controller 830 may control the gas concentration by, for example, opening and closing relevant valves to produce one or more inlet gas stream that provide the necessary reactant(s) at the proper concentration(s). The wafer movement may be controlled by, for example, directing a wafer positioning system to move as desired. The power supplied to the coils 833 and/or chuck 817 may be controlled to provide particular RF power levels. Similarly, if the internal grid 850 is used, any RF power applied to the grid may be adjusted by the system controller 830.

The system controller 830 may control these and other aspects based on sensor output (e.g., when power, potential, pressure, etc. reach a certain threshold), the timing of an operation (e.g., opening valves at certain times in a process), or based on received instructions from the user. System controller 830 may also control, or be the same controller as, controller unit 108 in FIG. 3, above. An example controller is further discussed below.

Figure 9A:
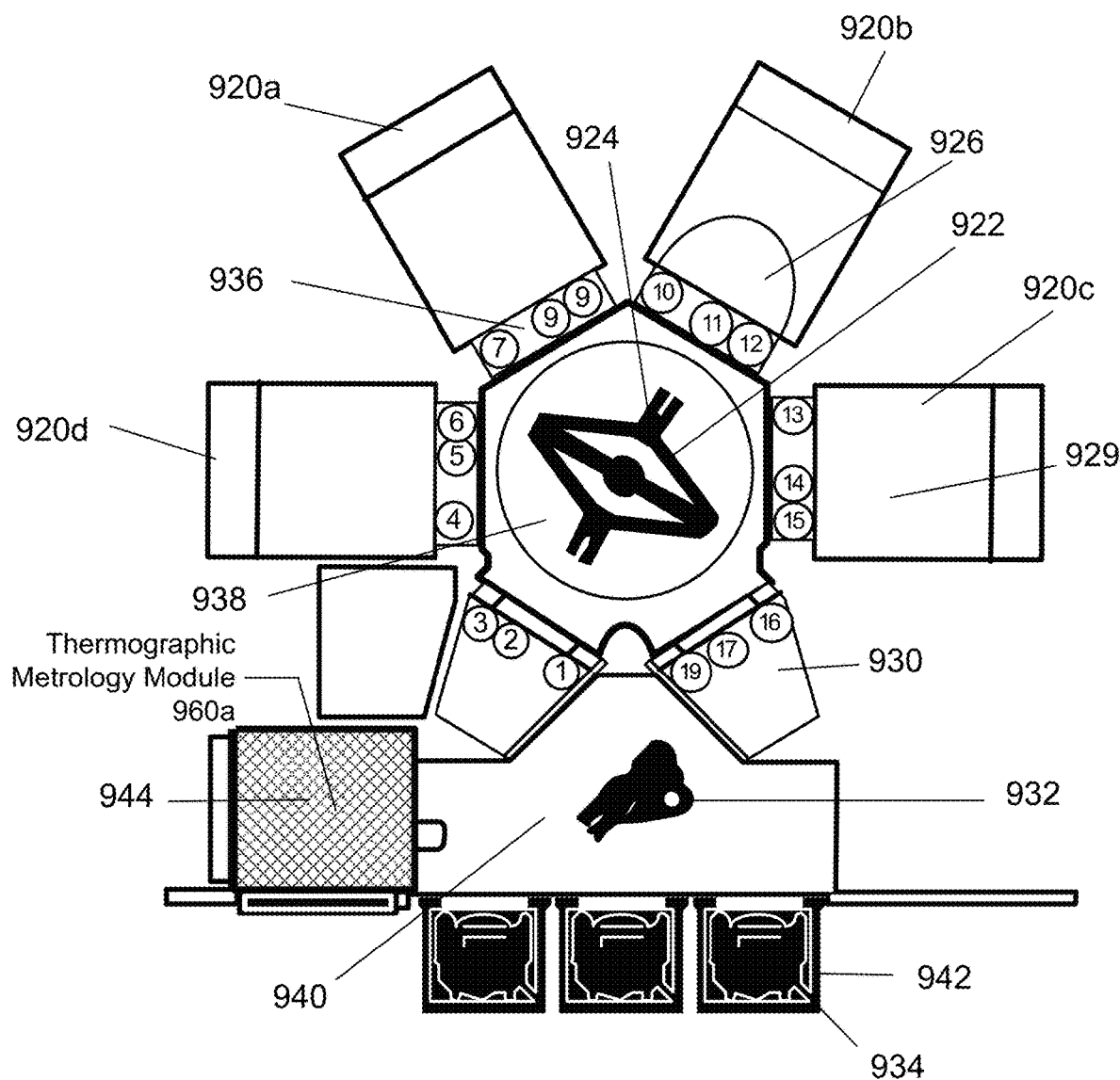
Figure 9B:
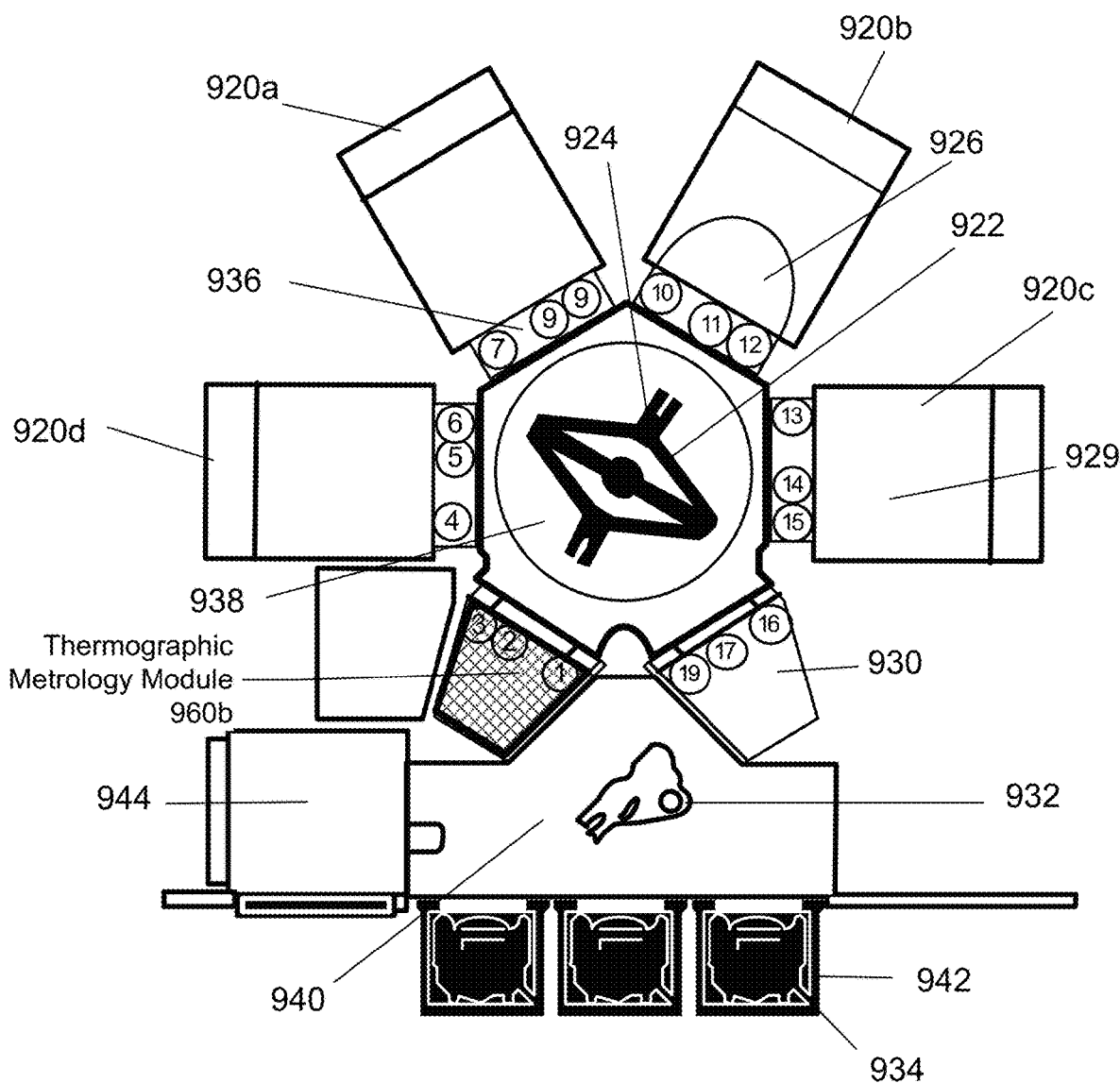
Figure 9C:
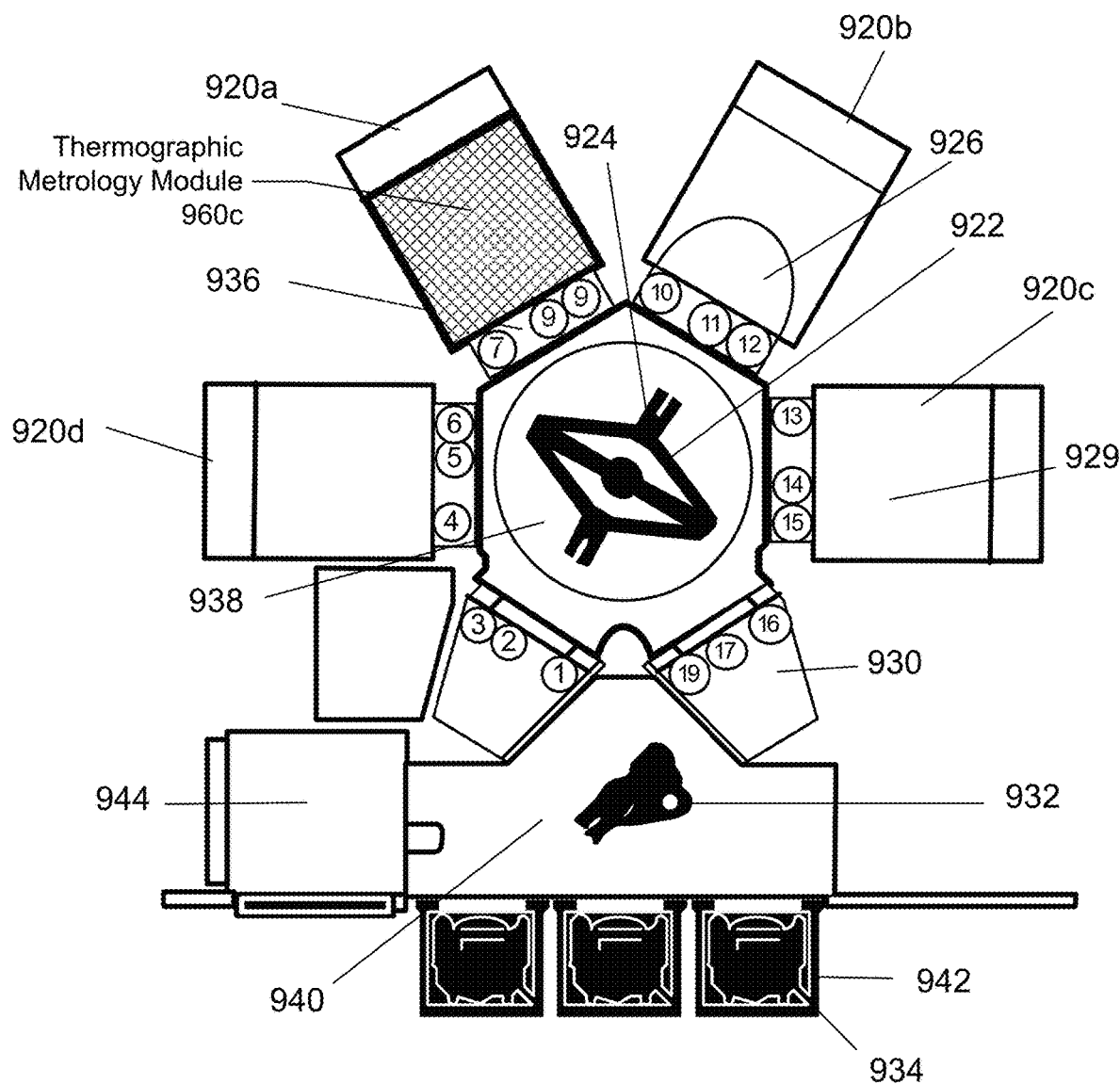

FIGS. 9A-C depicts a semiconductor process cluster architecture with various modules that interface with a vacuum transfer module 938 (VTM). The arrangement of transfer modules to "transfer" wafers among multiple storage facilities and processing modules may be referred to as a "cluster tool architecture" system. Airlock 930, also known as a loadlock or transfer module, is shown in VTM 938 with four processing modules 920a-920d, which may be individually optimized to perform various fabrication processes. By way of example, processing modules 920a-920d may be implemented to perform substrate etching, deposition, ion implantation, wafer cleaning, sputtering, and/or other semiconductor processes. One or more of the substrate etching processing modules (any of 920a-920d) may be implemented as disclosed herein. Airlock 930 and process module 920 may be referred to as "stations." Each station has a facet 936 that interfaces the station to VTM 938. Inside each facet, sensors 1-18 are used to detect the passing of wafer 926 when moved between respective stations.

Robot 922 transfers wafer 926 between stations. In one embodiment, robot 922 has one arm, and in another embodiment, robot 922 has two arms, where each arm has an end effector 924 to pick wafers such as wafer 926 for transport. Front-end robot 932, in atmospheric transfer module (ATM) 940, is used to transfer wafers 926 from cassette or Front Opening Unified Pod (FOUP) 934 in Load Port Module (LPM) 942 to airlock 930. Module center 928 inside process module 920 is one location for placing wafer 926. Aligner 944 in ATM 940 is used to align wafers.

In an exemplary processing method, a wafer is placed in one of the FOUPs 934 in the LPM 942. Front-end robot 932 transfers the wafer from the FOUP 934 to an aligner 944, which allows the wafer 926 to be properly centered before it is etched or processed. After being aligned, the wafer 926 is moved by the front-end robot 932 into an airlock 930. Because airlock modules have the ability to match the environment between an ATM and a VTM, the wafer 926 is able to move between the two pressure environments without being damaged. From the airlock module 930, the wafer 926 is moved by robot 922 through VTM 938 and into one of the process modules 920a-920d. In order to achieve this wafer movement, the robot 922 uses end effectors 924 on each of its arms. Once the wafer 926 has been processed, it is moved by robot 922 from the process modules 920a-920d to an airlock module 930. From here, the wafer 926 may be moved by the front-end robot 932 to one of the FOUPs 934 or to the aligner 944.

Each of FIGS. 9A-C demonstrate a different location for a thermographic metrology module as described herein. In FIG. 9A, a thermographic metrology module 960a is located within ATM 940. In FIG. 9B, thermographic metrology module 960b is located within airlock 930. In FIG. 9C, thermographic metrology module 960c is located within processing module 920a.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating, cooling, and setting temperature values for each temperature control zone), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

Without limitation, example systems may include a plasma etch chamber or module, a bevel edge etch chamber or module, an atomic layer etch (ALE) chamber or module, and any other etch semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments. Accordingly, the present embodiments are to be considered as illustrative and not restrictive, and the embodiments are not to be limited to the details given herein.

The invention claimed is:

1. A method, comprising:
    obtaining a thermographic image of a partially processed wafer, wherein the thermographic image contains infrared (IR) radiation intensity values for a plurality of positions of a surface of the wafer;
    determining processing parameters for a fabrication operation by a process chamber based at least in part on the thermographic image, wherein the process chamber has a pedestal having a plurality of independently controllable temperature control zones arranged in proximity to a location of a substrate during the fabrication operation, and the plurality of positions of the thermographic image are based on the plurality of independently controllable temperature control zones; and
    applying the processing parameters to the process chamber for the fabrication operation.

2. The method of claim 1, wherein the fabrication operation is performed on the wafer using the processing parameters.

3. The method of claim 1, wherein the fabrication operation is performed on a second wafer using the processing parameters.

4. The method of claim 1, further comprising placing the partially processed wafer proximate to a thermal source prior to obtaining the thermographic image.

5. The method of claim 1, wherein obtaining the thermographic image comprises:
    heating the wafer to a target temperature; and
    detecting IR radiation from the surface of the wafer for the plurality of positions.

6. The method of claim 5, wherein heating the wafer to a target temperature includes exposing the wafer to a thermal source with a low-emissivity coating.

7. The method of claim 6, wherein the low-emissivity is an emissivity less than about 0.02.

8. The method of claim 5, wherein detecting IR radiation from the surface of the wafer for the plurality of positions occurs at a first time after directing IR radiation through the wafer.

9. The method of claim 1, wherein obtaining a thermographic image comprises:
    directing IR radiation through the wafer; and
    detecting IR radiation from the surface of the wafer for the plurality of positions.

10. The method of claim 9, wherein the IR radiation is from a thermal source exhibiting a high emissivity.

11. The method of claim 10, wherein the wafer is not in thermally conductive contact or thermally convective contact with the thermal source.

12. The method of claim 10, wherein the IR intensity values at least partially represent IR radiation emitted by the thermal source and transmitted by the wafer.

13. The method of claim 1, wherein obtaining a thermographic image is performed under vacuum.

14. The method of claim 1, wherein the processing parameters include one or more of: radial temperature values for a pedestal in the process chamber, azimuthal temperature vales for a pedestal in the process chamber, process gas conditions, plasma conditions, or a vertical position of a pedestal.

15. The method of claim 1, wherein obtaining a thermographic image comprises filtering IR radiation using a wavelength filter.

16. The method of claim 1, wherein obtaining a thermographic image comprises detecting IR radiation using a hyperspectral detector.

17. The method of claim 1, wherein determining processing parameters further comprises analyzing the thermographic image using a transfer function.

18. The method of claim 17, wherein the transfer function is implemented as a trained machine learning model.

19. A thermographic metrology tool, comprising:
    a thermal source;
    an infrared radiation (IR) detector; and
    one or more processors and one or more memories comprising computer-executable instructions that, when executed, control the one or more processors to:
        obtain a thermographic image of a partially processed wafer, wherein the thermographic image contains infrared (IR) radiation intensity values for a plurality of positions of a surface of the wafer,
        determine processing parameters for a fabrication operation by a process chamber based at least in part on the thermographic image, wherein the process chamber has a pedestal having a plurality of independently controllable temperature control zones arranged in proximity to a location of a substrate during the fabrication operation, and the plurality of positions of the thermographic image are based on the plurality of independently controllable temperature control zones, and
        apply the processing parameters to the process chamber for the fabrication operation.

* * * * *